United States Patent
Kobayashi et al.

(10) Patent No.: US 7,488,683 B2
(45) Date of Patent: Feb. 10, 2009

(54) CHEMICAL VAPOR DEPOSITED FILM BASED ON A PLASMA CVD METHOD AND METHOD OF FORMING THE FILM

(75) Inventors: Akira Kobayashi, Yokohama (JP); Tsunehisa Namiki, Yokohama (JP); Hiroko Hosono, Yokohama (JP); Hideo Kurashima, Yokohama (JP); Hajime Inagaki, Yokohama (JP); Toshihide Ieki, Yokohama (JP)

(73) Assignee: Toyo Seikan Kaisha, Ltd., Tokyo (JP)

( * ) Notice: Subject to any disclaimer, the term of this patent is extended or adjusted under 35 U.S.C. 154(b) by 257 days.

(21) Appl. No.: 10/550,897

(22) PCT Filed: Mar. 23, 2004

(86) PCT No.: PCT/JP2004/003992

§ 371 (c)(1),
(2), (4) Date: Sep. 27, 2005

(87) PCT Pub. No.: WO2004/087989

PCT Pub. Date: Oct. 14, 2004

(65) Prior Publication Data

US 2006/0264044 A1    Nov. 23, 2006

(30) Foreign Application Priority Data

Mar. 28, 2003  (JP) .............................. 2003-092265
Aug. 8, 2003   (JP) .............................. 2003-206714

(51) Int. Cl.
    *H01L 21/44*   (2006.01)
    *C23C 16/00*   (2006.01)

(52) U.S. Cl. ................. 438/681; 438/680; 427/255.36; 427/255.37

(58) Field of Classification Search ................. 438/680, 438/681; 117/93, 95, 105; 427/255.36, 255.37
See application file for complete search history.

(56) References Cited

U.S. PATENT DOCUMENTS 5,718,967 A      2/1998   Hu et al.
6,485,564 B1 *  11/2002  Liu et al. ..................... 117/95
2003/0044552 A1  3/2003   Komada (Continued)

FOREIGN PATENT DOCUMENTS

EP           0 762 151 A2    3/1997

(Continued)

OTHER PUBLICATIONS

Supplementary European Search Report of EPA 04 72 2715 dated Dec. 19, 2006.

*Primary Examiner*—Kevin M Picardat
(74) *Attorney, Agent, or Firm*—Sughrue Mion, PLLC

(57) ABSTRACT

A method of forming a vapor deposited film of a silicon oxide on the surface of a substrate by holding the substrate to be treated in a plasma-treating chamber, and effecting the treatment with a chemical plasma by feeding an organosilicon compound and an oxidizing gas into the treating chamber, wherein the rate of feeding the oxidizing gas is varied while maintaining constant the rate of feeding the organosilicon compound gas into the plasma-treating chamber during the formation of the vapor deposited film. A chemical vapor deposited film is formed featuring excellent adhesiveness, softness, flexibility, oxygen-barrier property and water-barrier property.

14 Claims, 8 Drawing Sheets

(A)

(B)

U.S. PATENT DOCUMENTS

2004/0076836 A1   4/2004   Beldi et al.

FOREIGN PATENT DOCUMENTS

| | | |
|---|---|---|
| EP | 0762151 A2 * | 3/1997 |
| EP | 1 561 840 A | 8/2005 |
| JP | 6-212430 A | 8/1994 |
| JP | 9-68601 A | 3/1997 |
| JP | 11-309815 A | 11/1999 |
| JP | 2000-255579 A | 9/2000 |
| JP | 2003-276111 A | 9/2003 |
| WO | 02/10473 A | 2/2002 |

* cited by examiner

CHEMICAL VAPOR DEPOSITED FILM BASED ON A PLASMA CVD METHOD AND METHOD OF FORMING THE FILM

TECHNICAL FIELD

The present invention relates to a method of forming a vapor deposited film of a metal oxide such as a silicon oxide on the surface of a substrate such as a plastic substrate based on a plasma CVD method, and a vapor deposited film formed by this method.

BACKGROUND ART

The chemical vapor deposition method (CVD) is an art for precipitating a reaction product in the form of a film on the surface of a substrate based on the vapor-phase growth in a high-temperature atmosphere by using a starting gas which does not undergo the reaction at normal temperature, has been widely employed for the production of semiconductors and for reforming the surfaces of metals and ceramics, and has, in recent years, been also used for reforming the surfaces of plastic containers and, particularly, for improving gas-barrier property.

The plasma CVD is a process for growing a thin film by utilizing a plasma and basically comprises decomposing a gas containing a starting gas by an electric discharge of electric energy in a high electric field under a reduced pressure, and depositing a formed substance on the substrate through a chemical reaction in the vapor phase or on the substrate.

The plasma state is realized by a glow discharge. Depending upon the system of glow discharge, there have been known a method that utilizes a DC glow discharge, a method that utilizes a high-frequency glow discharge and a method that utilizes a microwave glow discharge.

There has been known a method of forming a silicon oxide film (SiOx) on the surface of a substrate such as a plastic container based on the plasma CVD method (see, for example, JP-A-2000-255579).

According to the method disclosed in the above prior document, a silicon oxide film is formed on the inner surface of the plastic container relying on a plasma treatment by a glow discharge by feeding a mixed gas of an organosilicon compound gas and an oxidizing gas into a plasma-treating chamber, wherein a feature resides in that the concentration of the organosilicon compound gas in the mixed gas fed into the plasma-treating chamber is varied while forming the film by the plasma treatment, offering an advantage in that the facility can be simplified in the exhaust system in the plasma-treating apparatus and the film can be formed in a shortened period of time.

The above method teaches the following means (a) to (c) for varying the concentration of the organosilicon compound gas in the mixed gas while forming the film.

(a) The amount of feeding the organosilicon compound gas is decreased (or decrease and increase are repeated) while forming the film;

(b) Feeding of the organosilicon compound gas itself is interrupted (or is interrupted and started again, or stop and start are repeated) while forming the film; and (c) The flow rate of the organosilicon compound gas and the flow rate of the oxygen gas (or gas having an oxidizing power) are both varied.

However, the silicon oxide film formed by the above method has a problem in that it lacks softness and flexibility, and adheres poorly to the substrate. When the substrate is a plastic material, in particular, this tendency becomes strong and the film tends to be broken. For example, when the hot water is preserved in a plastic container having a silicon oxide film formed on the inner surface thereof, the film is broken by the deformation of the container due to reduced pressure and even by a slight contraction of the container (though no problem is caused to the container in practice) due to the heat, making it difficult to obtain gas-barrier property and flavor-retaining property as desired.

According to this method which varies the concentration of the organosilicon compound gas itself, which is a source of feeding silicon that is an important element for constituting the vapor deposited film, gas-barrier property-tends to be dispersed when many substrates are treated making it difficult to obtain a predetermined gas-barrier property maintaining stability. This tendency becomes particularly conspicuous when a silicon oxide film having a small thickness yet a high performance is to be obtained through the treatment with a plasma in a short period of time.

Further, the conventional vapor deposited films formed by the above method have high barrier property against various gases (e.g., oxygen), but also exhibit high water-permeating property permitting water to infiltrate through the vacuum evaporated film and, hence, exhibiting decreased gas-barrier property. Therefore, it has been urged to improve the properties especially in the field of packaging materials.

DISCLOSURE OF THE INVENTION

It is therefore an object of the present invention to provide a method which is capable of forming a chemical vapor deposited film having excellent adhesiveness, flavor-retaining property and gas-barrier property on the surface of a substrate very easily maintaining stability relying upon a plasma CVD method.

Another object of the present invention is to provide a chemical vapor deposited film having particularly excellent barrier effect against the water among the above-mentioned properties and having excellent resistance against the alkaline content such as the alkali ion-containing water.

According to the present invention, there is provided a method of forming a vapor deposited film of a metal oxide on the surface of a substrate by holding the substrate to be treated in a plasma-treating chamber, and effecting the treatment with a chemical plasma by feeding at least an organometal compound and an oxidizing gas into the treating chamber, wherein a method of forming a chemical vapor deposited film based on a plasma CVD method is characterized in that the rate of feeding the oxidizing gas is varied while maintaining constant the rate of feeding the organometal compound gas into the plasma-treating chamber during the formation of the vapor deposited film.

In the method of the present invention, it is desired that:

1. The rate of feeding the oxidizing gas is increased, or is increased and is, then, decreased during the formation of the vapor deposited film;

2. An organosilicon compound is used as the organometal compound gas;

3. There are conducted a pre-vacuum evaporation for feeding only the organosilicon compound gas into the plasma-treating chamber and, thereafter, a main vacuum evaporation for feeding the organosilicon compound gas together with the oxidizing gas into the plasma-treating chamber;

4. A glow discharge for the treatment with a chemical plasma is established in a microwave electric field or in a high-frequency electric field;

5. The treatment with a chemical plasma in the step of main vacuum evaporation is conducted by varying the glow discharge from a low output region through up to a high output region;

6. After the main vacuum evaporation, an after-vacuum evaporation is conducted to effect the vacuum evaporation by decreasing or discontinuing the supply of the oxidizing gas into the plasma-treating chamber and, thereafter, the organosilicon compound is fed at a constant rate; and 7. The substrate is a plastic container.

By utilizing the above method, there is obtained a chemical vapor deposited film which features excellent adhesiveness, flavor-retaining property, gas-barrier property and, particularly, barrier effect against the water, as well as excellent resistance against the alkaline content such as the alkali ion-containing water.

The invention further provides a vapor deposited film formed on the surface of a substrate by a plasma CVD method by using an organometal compound gas and an oxidizing gas as reaction gases; wherein the vapor deposited film has a barrier layer region positioned on the side of the substrate and an outer surface protection layer region positioned on the surface of the barrier layer region; and on the basis of three elements of a metal element (M) stemming from the organometal compound, oxygen (O) and carbon (C), the barrier layer region has an (M+O) concentration which is higher than that of the outer surface protection layer region, the (M+O) concentration is substantially continuously varying in an interfacial portion between the barrier layer region and the outer surface protection layer region, and the outer surface protection layer region has a (C) concentration of not lower than 15 element %.

In the vapor deposited film of the present invention, it is desired that:

1. The element ratio (M/O) in the barrier layer region is in a range of 1.8 to 2.4;

2. Between the barrier layer region and the substrate surface, there is an adhesive layer region having an (M+O) concentration lower than that of the barrier layer region and having a (C) concentration of not lower than 20 element %;

3. The organometal compound is an organosilicon compound, and the metal (M) is silicon (Si);

4. The substrate is a plastic; and

5. The vapor deposited film is formed on the inner surface of a plastic bottle.

BEST MODE FOR CARRYING OUT THE INVENTION

Figure 1:
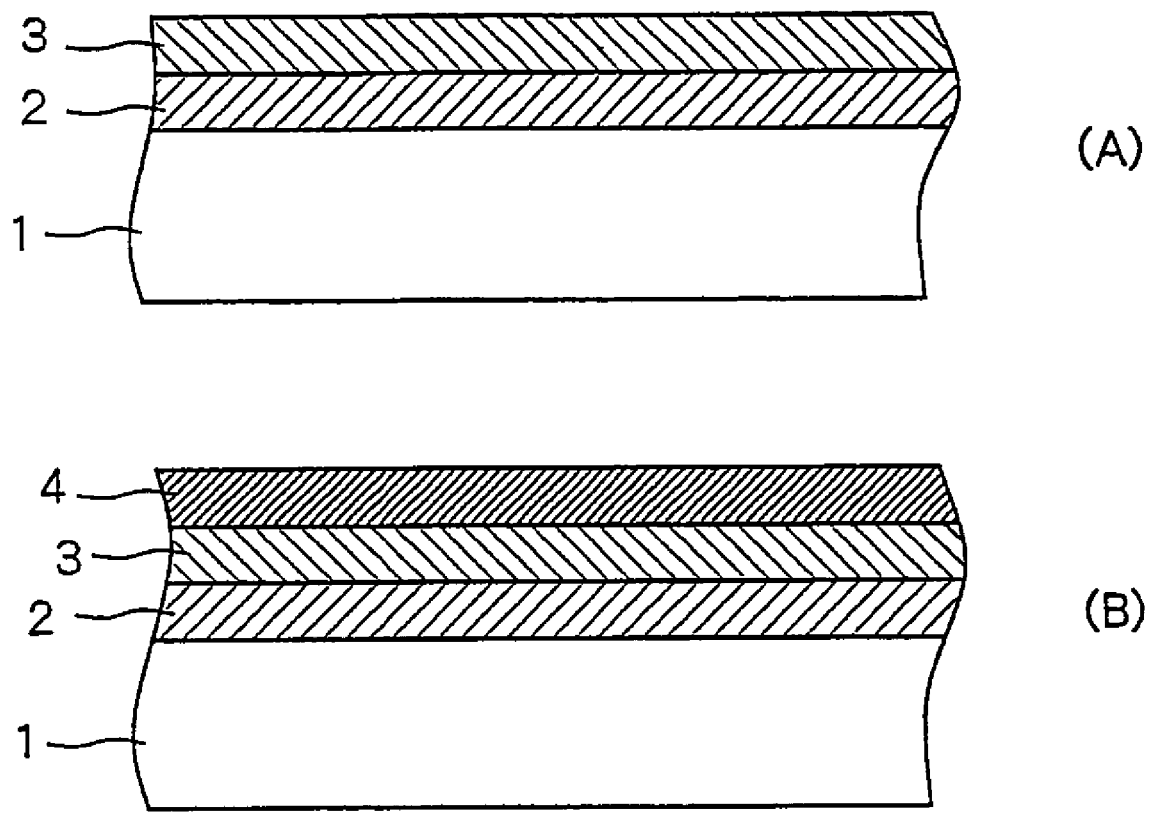
FIG. 1 is a sectional view illustrating a structure of a chemical vapor deposited film formed on the surface of a substrate according to a method of the present invention.

In the present invention, the treatment with a plasma is conducted while feeding a gas of an organometal compound (particularly, organosilicon compound) into a plasma-treating chamber at a constant rate at all times, and, here, an important feature resides in that the rate of feeding an oxidizing gas only is varied while forming the film. For example, the rate of feeding the oxidizing gas is increased, or is increased and is, then, decreased while forming the vapor deposited film. Preferably, a pre-vacuum evaporation is conducted by feeding the organosilicon compound gas only at a constant rate into the plasma-treating chamber, a main vacuum evaporation is conducted next by feeding the organosilicon compound gas at a constant rate together with the oxidizing gas into the plasma-treating chamber and, after the main vacuum evaporation, an after-vacuum evaporation is conducted, as required, by decreasing the rate of feeding the oxidizing gas or by discontinuing the feeding thereof while feeding the organosilicon compound gas into the plasma-treating chamber at a constant rate like in the pre-vacuum evaporation and in the main vacuum evaporation. Thus, the treatment with a plasma is conducted through a multiplicity of steps. The pre-vacuum evaporation may be shifted to the main vacuum evaporation continuously or sequentially though the continuous shifting is preferred.

When, for example, an organosilicon compound is used as the organometal compound, in general, it is considered that the silicon oxide film is formed by the treatment with a plasma by feeding the organosilicon compound gas and the oxidizing gas through the following reaction steps:

(a) Extraction of hydrogen: $SiCH_3 \rightarrow SiCH_2$.

(b) Oxidation: $SiCH_2. \rightarrow SiOH$ (c) Condensation: $SiOH \rightarrow SiO$ When the silicon oxide film is formed through the above reaction steps, the organosilicon compound undergoes the reaction at one time up to the step (c) as in the method disclosed by the above-mentioned prior art despite the treatment with a plasma is conducted while varying the concentration of the organosilicon compound gas in the reaction gas. Therefore, the obtained silicon oxide film lacks flexibility and has a low adhesiveness to the substrate. According to the present invention, on the other hand, the treatment with a plasma is conducted by feeding the organosilicon compound gas into the plasma-treating chamber at a constant rate at all times while varying the rate of feeding the oxidizing gas during the formation of the film. For example, in the step of pre-vacuum evaporation in the early stage of forming the film, the organosilicon compound gas only is fed at a constant rate but the oxidizing gas is not fed. Therefore, the reaction proceeds only up to the step (a), and there is formed an organosilicon polymer layer having excellent flexibility and good adhesiveness to the substrate such as a plastic owing to the reaction among the $SiCH_2$. radicals formed in this step. In the subsequent step of the main vacuum evaporation, the oxidizing gas is fed together with the organosilicon compound gas of a constant rate, whereby the reaction proceeds up to the step (c). As a result, a silicon oxide film having excellent gas-barrier property is formed on the organosilicon polymer film.

According to the present invention as will be understood from the foregoing and as shown in FIG. 1(A), an organosilicon polymer 2 is formed on the surface of a substrate 1 such as of a plastic through a step of pre-vacuum evaporation, and a silicon oxide (SiOx) layer 3 is formed through a subsequent step of main vacuum evaporation. That is, the silicon oxide layer 3 having excellent gas barrier property is formed on the surface of the substrate 1 via the organosilicon polymer layer 2 having excellent flexibility and good adhesiveness to the substrate 1. Therefore, if the film is formed on the inner surface of a plastic container by the treatment with a plasma according to the present invention, breakage of the film is effectively prevented as compared to when the silicon oxide layer 3 is directly formed on the inner surface of the container, excellent properties of the silicon oxide layer 3 are expressed maintaining stability, and there are obtained excellent gas-barrier property retaining the content from being deteriorated and improved flavor-retaining property.

According to the present invention described above, further, no oxidizing gas is fed in the step of pre-vacuum evaporation at the start of forming the film offering an additional advantage of effectively avoiding the surface of the substrate 1 from being deteriorated by etching with the oxidizing gas. That is, in the step of feeding the oxidizing gas, the organosilicon polymer layer 2 has been formed already on the surface of the substrate 1 effectively preventing the surface of the substrate 1 from being etched with the oxidizing gas. Therefore, the flavor-retaining property is further improved as a result of using the plastic container as the substrate 1 and applying the method of the present invention thereto.

In the present invention, the step of after-vacuum evaporation can be conducted, as required, following the above step of main vacuum evaporation. In the step of after-vacuum evaporation, the treatment with a plasma is conducted by feeding the oxidizing gas at a rate smaller than that in the step of main vacuum evaporation and, thereafter, feeding the organosilicon compound gas at a constant rate into the plasma-treating chamber. By conducting the step of after-vacuum evaporation, the organosilicon compound reacts at a decreased rate to proceed to the step (b) or (c), and a surface layer 4 of a composition close to that of the organosilicon polymer layer 2 is formed on the silicon oxide layer 3 as shown in FIG. 1(B). The surface layer 4 exhibits excellent hydrophobic property. Upon conducting the step of after-vacuum evaporation, therefore, it is made possible to further improve the barrier property against the water vapor.

According to the method of the present invention, a change in the composition of the film formed on the surface of the substrate 1 described above can be detected by, for example, the X-ray photoelectron spectroscopic analysis.

[Substrate]

In the present invention, the substrate to be treated with a plasma will be a glass and various metals. Most desirably, however, a plastic substrate is used. As the plastics, there can be used any known thermoplastic resins, e.g., polyolefins like random or block copolymers of α-olefins, such as low-density polyethylene, high density polyethylene, polypropylene, poly 1-butene, poly 4-methyl-1-pentene or ethylene, propylene, 1-butene, 4-methyl-1-pentene; ethylene/vinyl compound copolymers such as ethylene/vinyl acetate copolymer, ethylene/vinyl alcohol copolymer, ethylene/vinyl chloride copolymer; styrene resins such as polystyrene, acrylonitrile/styrene copolymer, ABS, α-methylstyrene/styrene copolymer; polyvinyl compounds such as polyvinyl chloride, polyvinylidene chloride, vinyl chloride/vinylidene chloride copolymer, methyl polyacrylate and methyl polymethacrylate; polyamides such as nylon 6, nylon 6-6, nylon 6-10, nylon 11 and nylon 12; thermoplastic polyesters such as polyethylene terephthalate, polybutylene terephthalate and polyethylene naphthalate; polycarbonate; polyphenylene oxide; biodegradable resins such as polybutyric acid; or any one of the mixtures thereof.

These substrates can be used in the form of a film or sheet or can further be used in the form of a container such as bottle, cup, tube, etc., or in the form of any other molded article.

As the bottle, in particular, there can be exemplified a biaxially draw-blow-formed bottle made of a polyester such as polyethylene terephthalate. The present invention can, similarly, be applied to the above polyester cup and the biaxially drawn film, too, as a matter of course.

Further, the plastic substrate may be the one of a multi-layer structure with gas-barrier property having the above-mentioned thermoplastic resin (preferably, a polyester resin) as the inner and outer layers, and an oxygen-absorbing layer between the inner layer and the outer layer. By forming a metal oxide film such as a silicon oxide film on the surfaces of the inner layer and/or the outer layer of the multi-layer structure, it is allowed to markedly improve the oxygen barrier property, as well as the barrier property against the carbonic acid gas and water vapor, and flavor-retaining property.

[Reaction Gas]

The present invention uses the organometal compound and the oxidizing gas as the reaction gases. As required, there can be further used hydrocarbons that form a source of carbon in combination.

In the present invention, an organosilicon compound is preferably used as the organometal compound. Not being limited to the organosilicon compound only, however, there can be further used an organoaluminum compound such as trialkylaluminum as well as organotitanium compounds provided they are capable of forming a metal oxide upon reacting with the oxidizing gas. As the organosilicon compound, there can be used organosilane compounds, such as hexamethyldisilane, vinyltrimethylsilane, methylsilane, dimethylsilane, trimethylsilane, diethylsilane, propylsilane, phenylsilane, methyltriethoxysilane, vinyltriethoxysilane, vinyltrimethoxysilane, tetramethoxysilane, tetraethoxysilane, phenyltrimethoxysilane, methyltrimethoxysilane and methyltriethoxysilane; and organosiloxane compounds, such as octamethylcyclotetrasiloxane, 1,1,3,3-tetramethyldisiloxane and hexamethyldisiloxane. There can be further used aminosilane and silazane.

The above organometal compounds can be used alone or in a combination of two or more kinds. It is, further, allowable to use silane ($SiH_4$) and silicon tetrachloride in combination with the above organosilicon compound.

As the oxidizing gas, there can be used oxygen and NOx. As the carrier gas, there can be used argon and helium.

As the source of carbon, further, there can be used hydrocarbons such as $CH_4$, $C_2H_4$, $C_2H_6$ and $C_3H_8$ in addition to the organosilicon compound and the organometal compound.

(Treatment with a Plasma)

In the present invention, a vapor deposited film of the above composition is formed on the surface of the substrate held in the plasma-treating chamber by effecting the treatment with a plasma relying on the plasma CVD method in an atmosphere containing the above-mentioned organometal compound gas, the oxidizing gas and the carrier gas.

In conducting the treatment with the plasma, the plasma-treating chamber must maintain a degree of vacuum which permits a glow discharge to take place. Generally, the pressure at the time of forming a film is maintained in a range of 1 to 200 Pa and, particularly, 5 to 50 Pa. In this state, microwaves and high-frequency waves are fed to generate a glow discharge to conduct a pre-vacuum evaporation, a main vacuum evaporation and, as required, an after-vacuum evaporation that will be described below. In the following steps, particularly, the organosilicon compound is used as the organometal compound.

Step of Pre-Vacuum Evaporation

In the step of pre-vacuum evaporation at the start of vacuum evaporation, the organosilicon compound gas (and, as required, a carrier gas) are fed at a constant rate into the plasma-treating chamber holding the substrate that is to be treated.

The rate of introducing the organosilicon compound varies depending upon the surface area of the substrate to be treated and the kind of the organosilicon compound. When the substrate is a plastic container, for example, it is desired that the starting silicon is fed at a relatively small rate of 0.5 to 50 cc/min and, particularly, 1 to 20 cc/min (hereinafter often simply described as sccm) per a container under a standard condition. In order to form the vapor deposited film of a stable composition without dispersion, it is desired that the flow rate is maintained constant at all times without being varied even in the step of main vacuum evaporation and in the step of after-vacuum evaporation that will be described later.

In the step of pre-vacuum evaporation, further, the oxidizing gas has not been fed as described already. Irrespective of the output for generating the glow discharge, therefore, the reaction of the organosilicon compound stands still at the step (a) of extracting hydrogen, and the organosilicon polymer layer 2 is formed by the reaction among the SiCH$_2$. radicals. Therefore, the glow discharge for generating the plasma can be triggered by either the microwaves or the high-frequency electric field of an output in a range which is not smaller than for reacting the organosilicon compound but does not cause the substrate to be thermally deformed. When the microwaves are used, the output thereof is 30 W to 1500 W. When the high-frequency waves are used, the output thereof is 50 W to 2000 W though it may vary depending also upon the chamber size.

The time for treatment with a plasma in the step of pre-vacuum evaporation varies depending upon the surface area of the substrate to be treated, thickness of the vapor deposited film to be formed and the kind of the organometal compound, and cannot be exclusively specified. However, if described concerning the treatment of the plastic container with a plasma using the organosilicon compound, it is desired that the organosilicon polymer film 2 is formed maintaining a thickness of about 0.1 to about 10 nm through the treatment for about 0.05 to about 5 seconds per a container. In the step of pre-vacuum evaporation, the oxidizing gas, depending upon the cases, may be fed in trace amounts so will not to impair the flexibility of the organosilicon polymer layer 2.

Step of Main Vacuum Evaporation

In the step of main vacuum evaporation conducted following the step of pre-vacuum evaporation, the silicon oxide layer 3 is formed by a glow discharge by feeding the oxidizing gas (and, as required, a carrier gas) into the plasma-treating chamber in addition to the organosilicon compound gas fed at a constant rate.

At this moment, the rate of introducing the oxidizing gas may vary depending upon the kind of the organosilicon compound gas and the surface area of the substrate to be treated, but must be fed at such a rate necessary for the film-forming reaction to proceed up to the final step (c). In general, it is desired that the oxidizing gas is fed at a relatively large flow rate of 5 to 500 sccm and, particularly, 10 to 300 sccm per a container.

In the step of main vacuum evaporation, further, it is desired that the glow discharge for generating a plasma is varied from a low output region through up to a high output region. That is, in this step, the reaction of the organosilicon compound is conducted following the step (a) of extracting hydrogen in the pre-vacuum evaporation, i.e., conducted at one time from the step (a) of extracting hydrogen through the step (b) of oxidation up to the step (c) of condensation. It is, therefore, desired that the discharge takes place in a low output region in the initial stage in the step of main vacuum evaporation and, thereafter, the reaction is conducted in a high output region in a range where the substrate is not thermally deformed. That is, if the output of glow discharge is low over the whole step of the main vacuum evaporation, an extended period of time is consumed before the step (c) of condensation is reached. Depending upon the cases, an organosilicon polymer is formed due to the reaction among the SiCH$_2$. radicals in a portion of the film, or SiOH generated in the step (b) of oxidation is formed in a portion of the film prior to arriving at the step (c) of condensation, and excellent gas-barrier property of the silicon oxide layer 3 may be deteriorated.

Therefore, when the microwaves are used, it is desired that the output of the glow discharge is varied from a range of 30 W to 300 W into a range of 100 W to 1500 W. When the high-frequency waves are used, it is desired that the output of the glow discharge is varied from a range of 50 W to 350 W into a range of 150 W to 2000 W.

The time for treatment with a plasma in the step of main vacuum evaporation, too, varies depending upon the surface area of the substrate to be treated, thickness of the vapor deposited film to be formed and the kind of the organosilicon compound, and cannot be exclusively specified. However, if described concerning the treatment of the plastic container with a plasma, it is desired that the silicon oxide layer 3 is formed maintaining a thickness of about 3 to about 300 nm through the treatment of not shorter than 1.5 seconds per a container.

Step of After-Vacuum Evaporation

After the step of main vacuum evaporation, the step of after-vacuum evaporation is conducted as required to form a surface layer 4 having excellent hydrophobic property as shown in FIG. 1(B).

In the step of after-vacuum evaporation, the rate of feeding the oxidizing gas is decreased (feeding of the oxidizing gas may be interrupted) and, at the same time, the organosilicon compound gas (and, as required, a carrier gas) are fed at a constant rate to conduct the treatment with a plasma like in the step of pre-vacuum evaporation and the step of main vacuum evaporation. Therefore, the surface layer 4 formed in this step has a composition close to the organosilicon polymer layer 2, exhibiting excellent hydrophobic property and effectively preventing the adsorption of water by the surface or the infiltration of water vapor from the surface.

In this step, therefore, it is desired that the output of glow discharge has been set to lie in the same output range as that of the step of pre-vacuum evaporation.

In the step of after-vacuum evaporation, too, the time for treatment with a plasma varies depending upon the surface area of the substrate to be treated, thickness of the vapor deposited film to be formed and the kind of the organosilicon compound, and cannot be exclusively specified. However, it is desired that the surface layer 4 is formed maintaining a thickness of about 0.1 to about 6 nm through the treatment for about 0.05 to about 3 seconds per a plastic container and, particularly, that the total thickness of the film (total thickness of the organosilicon polymer layer 2, silicon oxide layer 3 and surface layer 4) formed on the surface of the substrate 1 is in a range of 2 to 500 nm and, particularly, 5 to 300 nm. The rate of feeding the oxidizing gas can be suitably varied when the step of pre-vacuum evaporation is shifted to the step of main vacuum evaporation and when the step of main vacuum evaporation is shifted to the step of after-vacuum evaporation. For example, there can be employed means which increases or decreases the feeding rate instantaneously or gradually.

(Vapor Deposited Film)

The vapor deposited film formed through the steps of pre-vacuum evaporation, main vacuum evaporation and after-vacuum evaporation has a stratified structure comprising the organosilicon polymer layer 2, silicon oxide layer 3 and surface layer 4 as shown in FIG. 1(B) though there is no vivid interface among the layers in practice. If the vapor deposited film having the above stratified structure is measured for its element concentrations on the basis of three elements of a metal element (M: e.g., Si) stemming from the organometal compound, oxygen (O) and carbon (C), there are found concentration profiles along the direction of thickness as shown in FIG. 2.

Figure 2:
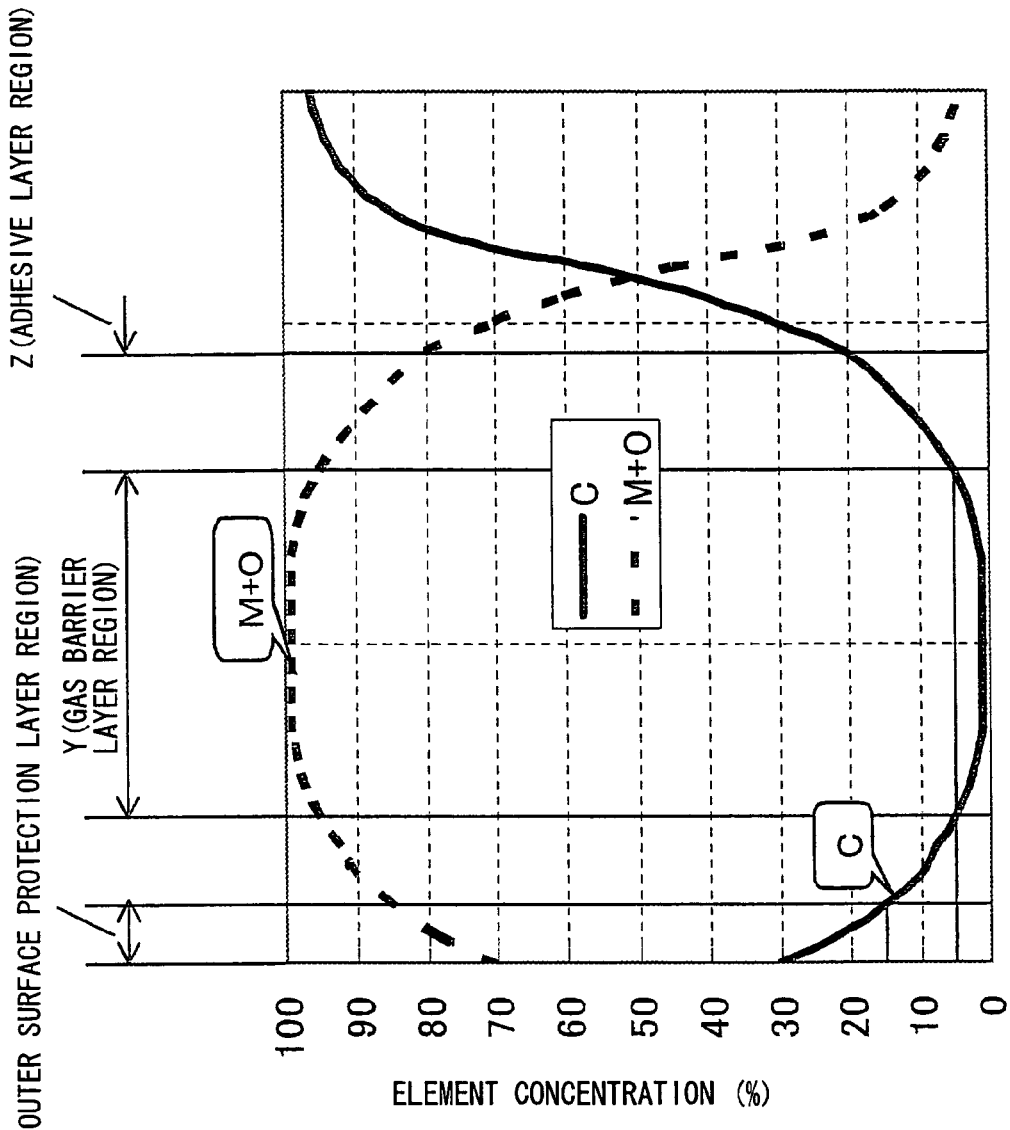
FIG. 2 is a diagram illustrating a composition of elements in the direction of thickness of the vapor deposited film of the present invention.

That is, FIG. 2 schematically illustrates an element composition (Si, O, C) of the vapor deposited film of the invention measured by the X-ray photoelectron spectroscopic analysis. The vapor deposited film can be divided into three regions of an outer surface protection layer region X (corresponds to the surface layer 4), a gas-barrier layer region Y (corresponds to the silicon oxide layer 3) and an adhesive layer region Z (corresponds to the organosilicon polymer layer 2) from the side of the outer surface toward the surface of the substrate.

In FIG. 2, it is important that the outer surface protection layer region X positioned on the outer surface of the vapor deposited film has a (C) concentration of not lower than 15 element %, preferably, not lower than 22 element % and, most desirably, not lower than 40 element % and is richly organic. When the (C) concentration is lower than the above range, the amount of oxygen atoms (O) or OH groups increases in the surface region and, as a result, the surface of the vapor deposited film becomes richly hydrophilic. In this case, too, if the adhesive layer region and the barrier layer region are suitably formed through the steps of pre-vacuum evaporation and main vacuum evaporation according to the vapor deposition method of the present invention, a barrier property is maintained for most of the contents to a degree that is practically satisfactory. When the contents are alkaline or contain alkali ions, however, the surface of the vapor deposited film that is hydrophilic tends to be damaged by alkali and, as a result, the gas-barrier property tends to be deteriorated. The vapor deposited film of the present invention forming a region which is richly organic in the surface thereof, on the other hand, exhibits not only further improved shut-off property (barrier property), particularly, against the water but also excellent resistance against alkalis owing to its hydrophobic property in the surface.

The outer surface protection layer region X can be easily formed by the method (step) of after-vacuum evaporation described in this application by varying only the rate of feeding the oxidizing gas, to which method only, however, the invention is in no way limited.

Further, the gas barrier layer region Y corresponding to the silicon oxide layer 3 has a (C) concentration which is smaller than 5 element %, has an (Si+O) concentration higher than that in the outer surface protection layer region X, and is formed through the above step of main vacuum evaporation. That is, the region Y formed in the central portion of the vapor deposited film is lowly organic, richly inorganic and, particularly, has a high barrier property against oxygen. When an organosilicon compound such as hexamethyldisiloxane (HMDSO) is used as the organometal compound, the gas barrier layer region chiefly comprises a silicon oxide. From the standpoint of gas-barrier property and transparency, in particular, it is desired that the element ratio of O/M (O/Si) in this region is in a range of 1.8 to 2.4.

The vapor deposited film of the present invention having the above gas-barrier layer region Y can be effectively used in the field of packaging material such as plastic containers that require barrier property against gases such as oxygen and carbonic acid gas.

The adhesive layer region Z formed between the gas-barrier layer region Y and the surface of the substrate 1 corresponds to the organosilicon polymer layer 2 formed through the above step of pre-vacuum evaporation, and has a (C) concentration of not lower than 20 element %. This region, too, is highly organic like in the outer surface protection layer region X. That is, the gas-barrier layer region Y is highly inorganic and has a high oxygen-barrier property accompanied, however, by a low flexibility and often lacking adhesiveness to the substrate. However, the adhesive layer region which is highly organic has a high flexibility and good adhesiveness to the substrate. By forming the gas-barrier layer region Y on the surface of the substrate with the highly organic adhesive layer region Z held therebetween, therefore, it is made possible to effectively avoid a drop in the adhesiveness.

In the present invention as will be understood from FIG. 2, further, it is important that the (Si+O) concentration is varying substantially continuously in the interfacial portion between the barrier layer region Y corresponding to the silicon oxide layer 3 and the outer surface protection layer region X corresponding to the surface layer 4, and that the (Si+O) concentration is varying substantially continuously even in the interfacial portion between the barrier layer region Y and the adhesive layer region Z. That is, in these interfacial portions, the (Si+O) concentration is continuously and monotonously decreasing or increasing, meaning that the regions X, Y and Z have been integrally formed without no distinct interface among the neighboring regions. Accordingly, the vapor deposited film of the present invention does not permit exfoliation among the regions, and exhibits very excellent durability and a barrier property against gases such as oxygen and water maintaining stability over extended periods of time.

According to the present invention as described above, the outer surface protection layer region X corresponding to the surface layer 4, the barrier layer region Y corresponding to the silicon oxide layer 3 and the adhesive layer region Z corresponding to the organosilicon polymer layer 2 are all existing without forming explicit layers, and there is not explicit interface among the regions (layers). Therefore, though it is not allowed to critically define the thicknesses of the regions, the thickness of the vapor deposited film (total thickness of the regions) is usually in a range of 4 to 500 nm. In order to obtain further increased barrier property against the water and resistance against the alkali, it is desired that the outer surface protection layer region X is formed up to a depth of not smaller than 0.2 nm from the surface, that the gas-barrier layer region Y has a thickness of not smaller than about 4.0 nm, that the adhesive layer region Z has a thickness of not smaller than about 0.2 nm, and that the above-mentioned steps of pre-vacuum evaporation, main vacuum evaporation and after-vacuum evaporation are so conducted as to form the above regions X, Y and Z.

In the present invention, further, it is desired that the surface of the outer surface protection layer region X is roughly formed to further improve the barrier property against the water. For example, upon adjusting the average surface roughness Ra (JIS B0601) to be about 0.1 to about 10.0 nm, the barrier property is further improved against the water. The rough surface can be formed by adjusting the degree of pressure reduction for a glow discharge in forming, for example, the vapor deposited film, and effecting the glow discharge under a relatively high pressure.

In the present invention, when the substrate to be treated is a solid molded article such as a plastic container, the above-mentioned treatment is effected for the interior and/or the exterior of the plastic container, and a chemical vapor deposited film of the invention having the above-mentioned stratified structure is formed on the inner surface and/or the outer surface of the container.

(Treating Apparatus)

Figure 3:
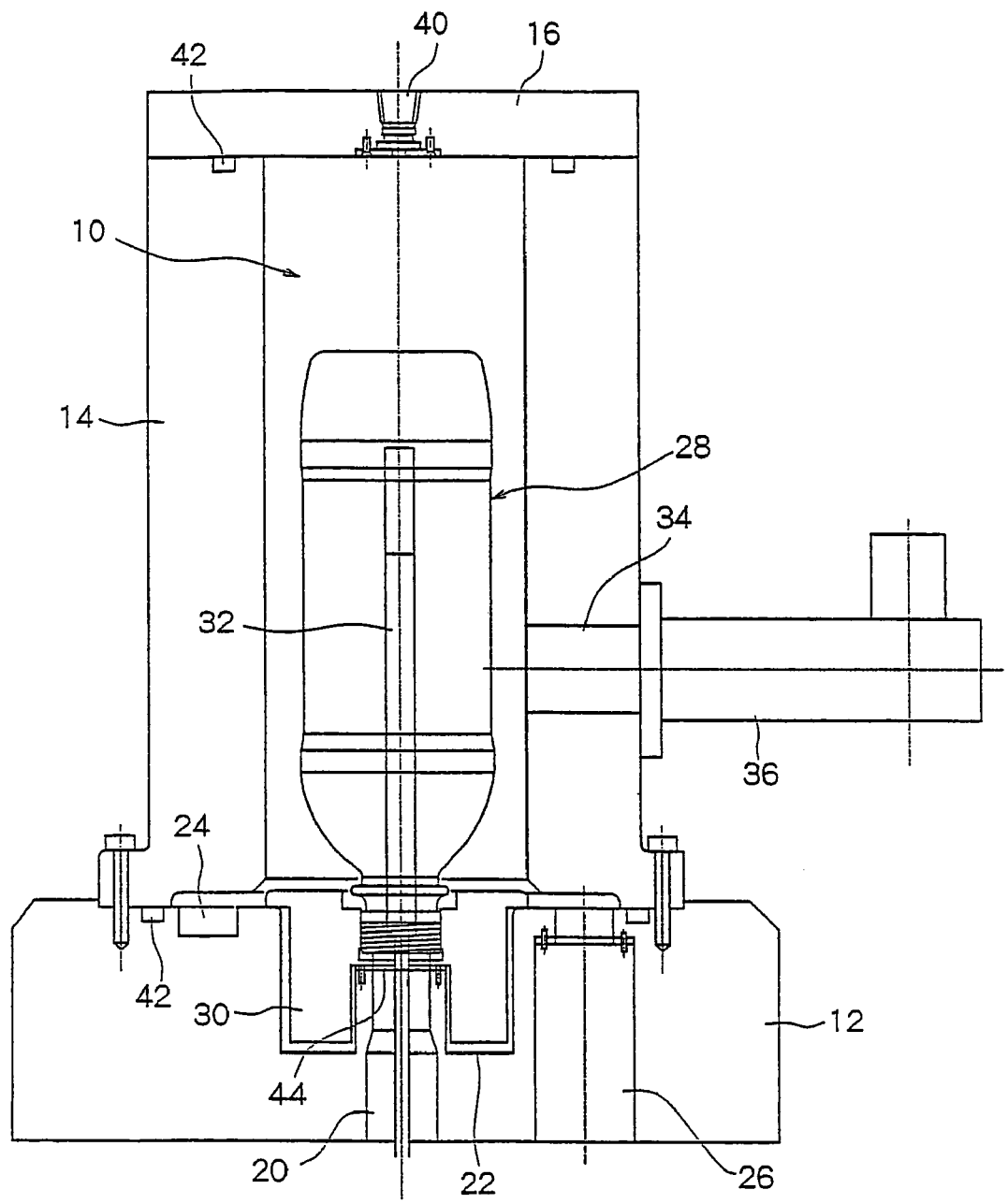
FIG. 3 is a view schematically illustrating the arrangement of a microwave plasma-treating apparatus suited for putting the method of the invention into practice.

The structure of a plasma-treating apparatus for executing the above-mentioned method of the present invention is shown in FIG. 3 with reference to a case of treating the inner surface of the plastic bottle with a plasma relying upon a microwave glow discharge.

In FIG. 3, the plasma-treating chamber generally designated at 10 is constituted by an annular base plate 12, a cylindrical chamber 14 mounted on the annular base plate 12 by using pins, and a top closure 16 closing the upper portion of the chamber 14.

A bottle holder 18 which is also of an annular shape is provided in the inner hollow portion of the annular substrate 12, the mouth portion of a plastic bottle 20 is held by the bottle holder 18, and the bottle 20 is held upside down in the chamber 14. An evacuation pipe 22 is connected to the inner hollow portion of the base plate 12 to maintain a reduced pressure in the bottle 20, and a shield 24 for confining the microwaves is provided near the upper end of the mouth portion of the bottle 20 that is held upside down.

The base plate 12 is further provided with an evacuation pipe 26 for maintaining a reduced pressure in the chamber 14 (in the treating chamber 10). Further, a gas-feeding pipe 30 which may be a metallic porous pipe is inserted in the bottle 20 from the hollow portion on the inside of the annular base plate 12. Through the gas-feeding pipe 30, the reactive gases for effecting the treatment with a plasma (i.e., the organosilicon compound gas and the oxidizing gas) are fed into the bottle 20.

On the other hand, a microwave transmission member 32 such as a waveguide or a coaxial cable is connected to the chamber 14, and microwaves are introduced from a predetermined microwave oscillator into the plasma-treating chamber 10 through the microwave transmission member 32.

The top closure 16 is provided with an air-feeding pipe 34 for introducing the external air into the chamber 14, as required.

In the above-mentioned apparatus, it is desired that the gas-feeding pipe 30 is inserted in the bottle in a manner that the length from a shield 24 to an end thereof (corresponds to a length from the upper end of the mouth portion of the bottle 20 to an end of the feeding pipe 30) becomes nearly equal to an integer times of the half-wave length of the microwave±15 mm and that, in this range, the end thereof is located at a position as close to the bottom of the bottle 20 as possible. Namely, owing to the electrical matching with the microwaves, a plasma is formed within a short period of time from the start of introducing the microwaves to efficiently form a predetermined film.

To conduct the treatment with a plasma, first, a vacuum pump is driven and the interior of the bottle 20 is maintained in a vacuum state by the evacuation through the evacuation pipe 22. Here, in order to prevent the bottle 20 from being deformed by the external pressure, the pressure in the chamber 14 (plasma-treating chamber 10) in the exterior of the bottle, too, is decreased through the evacuation pipe 26.

As described above, the degree of decreasing the pressure in the bottle 20 is so high that a glow discharge takes place when the treating gas is introduced through the gas-feeding pipe 30 and when the microwaves are introduced. On the other hand, the degree of decreasing the pressure in the chamber 14 (exterior of the bottle 20) is such that there takes place no glow discharge even when the microwaves are introduced.

After the pressures have been thus decreased, microwaves are introduced into the plasma-treating chamber 10 through the microwave transmission member 32 while feeding the gas through the gas-feeding pipe 30, and a plasma is generated by a glow discharge. The temperature of electrons in the plasma is several tens of thousand degrees K which is higher by about two digits than the temperature of gas particles, which is several hundred degrees K, creating a thermally imbalanced state and permitting the plastic substrate of even a low temperature to be effectively treated with a plasma.

Namely, in the present invention, the rate of feeding the organosilicon compound gas is set to be constant in conducting the treatment with the plasma, and the oxidizing gas is introduced in a suitable step into the bottle 20 being mixed with the organosilicon compound gas to conduct the step of pre-vacuum evaporation, the step of main vacuum evaporation and, as required, the step of after-vacuum evaporation in order to form a vapor deposited film having a stratified structure as shown in FIG. 1($a$) or 1($b$) and a composition profile as shown in FIG. 2.

After the above step of vacuum evaporation, no treating gas is introduced through the gas-feeding pipe 20 and no microwave is introduced. The cooling air is gradually introduced through the air-feeding pipe 34, the pressures in the inside and outside of the container are returned to normal, and the bottle treated with the plasma is taken out of the plasma-treating chamber 10 thereby to obtain the bottle treated with the plasma.

EXAMPLES

Excellent effects of the invention will be described next by way of Examples.

1. Production of a Vapor-Deposited Bottle.

There was used an apparatus illustrated in FIG. 3 having a microwave power source of a frequency of 2.45 GHz and a maximum output of 1.2 kW, a metallic cylindrical plasma-treating chamber of a diameter of 90 mm and a height of 500 mm, a hydraulically rotated vacuum pump for evacuating the treating chamber, and a rectangular waveguide for introducing the microwaves from an oscillator into the plasma-treating chamber. As the gas-feeding pipe, there was used a sintered stainless steel gas-feeding pipe of a porous structure having an outer diameter of 15 mm and a length of 180 mm.

By using the above apparatus, a bottle made of a polyethylene terephthalate having an inner volume of 500 ml was inserted in a plasma-treating chamber 10 (chamber 14) which was, then, evacuated by the vacuum pump to maintain spaces inside and outside of the bottle to be 20 Pa and 3000 Pa, respectively. Then, as shown in Table 1, the organosiloxane compound gas (A) and the oxygen gas (B) which are the treating gases were fed depending upon the experimental examples and the step of vacuum evaporation to conduct the treatment with a chemical plasma by the irradiation with microwaves (output C).

Next, in order to evaluate the effect of the treating conditions upon the adhesiveness, the bottles which, after having been treated, were filled with the distilled water of 90° C., preserved at 40° C. for 2 weeks, and were evaluated for their barrier properties as described below.

2. Evaluation of Barrier Properties.

(1) Oxygen-Barrier Property.

Concerning the oxygen-barrier property, the amount of oxygen permeation was measured by using the OXTRAN of MOCON Co., under the conditions of 37° C. and 50%. The evaluation was on the following basis:
- less than 0.01 cc/bottle/day→◎
- less than 0.02 cc/bottle/day→○
- larger than 0.02 cc/bottle/day→X (poorer than permissible limit)

(2) Water Vapor-Barrier Property.

The bottles were fully filled with the water, sealed with aluminum caps and were measured for their reduction of weight after preserved under the conditions of 40° C. and 20% for 3 weeks. The evaluation was on the following basis:
- less than 0.01 g/bottle/day→◎
- less than 0.02 g/bottle/day→○
- larger than 0.02 g/bottle/day→X (poorer than permissible limit)

Example 1

The pre-vacuum evaporation, the main vacuum evaporation and the after-vacuum evaporation were conducted under the conditions shown in Table 1 to obtain vapor-deposited bottles exhibiting favorable properties in any evaluation as shown in Table 1.

Example 2

The pre-vacuum evaporation, the main vacuum evaporation and the after-vacuum evaporation were conducted under the conditions shown in Table 1 to obtain vapor-deposited bottles exhibiting favorable properties in any evaluation as shown in Table 1.

Example 3

The pre-vacuum evaporation and the main vacuum evaporation were conducted under the conditions shown in Table 1 to obtain vapor-deposited bottles having properties sufficiently satisfactory as the products though the water-barrier property was slightly inferior to those of Examples 1 and 2.

Comparative Example 1

The main vacuum evaporation only was conducted as shown in Table 1 to obtain bottles which were inferior in both oxygen-barrier property and water-barrier property to those of Examples 1 and 2 presumably because the vapor deposited film of the obtained bottles was not adhered to a satisfactory degree. Further, offensive taste and offensive odor were felt from the water filled in the bottles due presumably to that the polyethylene terephthalate was exposed to the oxygen plasma.

Comparative Example 2

The oxygen gas was fed in the same small amount as the organosiloxane compound gas in the pre-vacuum evaporation as shown in Table 1 to obtain bottles which were inferior in both oxygen-barrier property and water-barrier property to those of Examples 1 and 2 presumably because the vapor deposited film of the obtained bottles was not adhered to a satisfactory degree. Further, though fainter than those of Comparative Example 1, offensive taste and offensive odor were felt from the water filled in the bottles due presumably to that the polyethylene terephthalate was exposed to the oxygen plasma.

Comparative Example 3

The treatment was conducted under the conditions in which the microwave output only was different from that of Example 2 as shown in Table 1. However, satisfactory properties were not obtained in any evaluation presumably due to a lack of energy in the steps of vacuum evaporation.

TABLE 1

| Step of vaccum evaporation | | Treating condition | | | | Barrier property | |
|---|---|---|---|---|---|---|---|
| | | Gas A (SCCM) | Gas B (SCCM) | Output C (W) | Time (sec.) | Oxygen | Water vapor |
| Ex. 1 | Pre- | 3 | 0 | 500 | 0.5 | | |
| | Main | 3 | 30 | 500 | 6 | ◎ | ◎ |
| | After- | 3 | 0 | 500 | 0.5 | | |
| Ex. 2 | Pre- | 3 | 0 | 500 | 0.5 | | |
| | Main | 3 | 30 | 500 | 6 | ◎ | ◎ |
| | After- | 3 | 15 | 500 | 0.5 | | |
| Ex. 3 | Pre- | 3 | 0 | 500 | 0.5 | | |
| | Main | 3 | 30 | 500 | 6 | ◎ | ○ |
| | After- | — | — | — | — | | |
| Comp. Ex. 1 | Pre- | — | — | — | — | | |
| | Main | 3 | 30 | 500 | 6 | X | X |
| | After- | — | — | — | — | | |

TABLE 1-continued

| Step of vaccum evaporation | | Treating condition | | | | Barrier property | |
|---|---|---|---|---|---|---|---|
| | | Gas A (SCCM) | Gas B (SCCM) | Output C (W) | Time (sec.) | Oxygen | Water vapor |
| Comp. Ex. 2 | Pre- | 3 | 3 | 500 | 0.5 | | |
| | Main | 3 | 30 | 500 | 6 | X | X |
| | After- | — | — | — | — | | |
| Comp. Ex. 3 | Pre- | 3 | 0 | 20 | 0.5 | | |
| | Main | 3 | 30 | 90 | 6 | X | X |
| | After- | — | — | — | — | | |

In order to clarify a relationship between the composition in the vapor deposited film and the resistance against alkalis in the following Applied Experiments 1 to 7, the composition of the vapor deposited film was analyzed and the characteristics of the vapor deposited film (water-barrier property, oxygen-barrier property, adhesiveness) were evaluated in accordance with the following methods, and the results were shown in Table 2. Analysis of composition in the vapor deposited film:

The inner surface of the body wall of the bottle coated with a vapor deposited film was measured for its composition profile of silicon, oxygen and carbon in the direction of depth of the film by using an X-ray photoelectron spectroscope (Quantum 2000) manufactured by PHI Co.

The silicon concentration and the oxygen concentration were corrected on the basis of the molten quartz ($SiO_2$), and the thickness of the film was estimated relying upon the rate of sputtering the same as the one for the molten quartz ($SiO_2$) for convenience.

Evaluation of Water-Barrier Property:

A PET bottle of which the inner surface has been coated with the vapor deposited film was filled with the alkali ion-containing water (commercially available alkali ion-containing water, pH 8.5) in an amount of 500 ml at room temperature, was sealed at the mouth thereof with an aluminum foil laminate having a sealant, was measured for its overall weight (M1) and was measured for its overall weight (M2) after preserved for 14 days in an environment of 40° C. and 90% RH to make sure the amount of water permeation M1-M2 and to evaluate the water-barrier property.

Evaluation of Oxygen-Barrier Property:

After the alkali ion-containing water was removed from the bottle that has been measured for its water-barrier property, the bottle was measured for its amount of oxygen permeation by using an oxygen permeation-measuring device (OX-TRAN, manufactured by Modan Control Co.) in an atmosphere of 37° C. and 100% RH.

Evaluation of Adhesiveness:

A square test piece measuring 15 mm was cut out from the body wall of the PET bottle of which the inner surface has been coated with the vapor deposited film, preserved in the alkali ion-containing water maintained at 70° C. for 2 days, measured for its silicon amount in the film with the passage of time by using a fluorescent X-ray analyzer (Rigaku ZSX) to evaluate the adhesive force of the vapor deposited film relying upon the remainder.

[Applied Experiment 1]

By using the apparatus shown in FIG. 3 like in the above-mentioned Examples and Comparative Examples, a cylindrical polyethylene terephthalate bottle (PET bottle) having a mouth of a diameter of 28 mm, a body of a diameter of 64 mm, a height of 206 mm and a volume of 520 ml was installed in the bottle holder, the exterior of the bottle in the treating-chamber was evacuated down to 7 kPa, the interior thereof was evacuated down to 10 Pa, a plasma was generated in the PET bottle by transmitting microwaves of 500 W therein from a microwave oscillator while introducing a hexamethyldisiloxane (HMDSO) at a rate of 3 sccm to effect the treatment with the plasma, followed by the start of pre-vacuum evaporation, main vacuum evaporation and after-vacuum evaporation thereby to form a vapor deposited film comprising an adhesive layer region Z, barrier layer region Y and outer surface protection layer region X. The times for vapor deposition of the layers were 0.5 sec, 6 sec and 0.5 sec, respectively.

After the pre-vacuum evaporation, the main vacuum evaporation was conducted by introducing 30 sccm of oxygen while feeding the HMDSO thereby to form the barrier layer region Y. In the subsequent after-vacuum evaporation, the HMDSO was continuously fed but the oxygen was no longer fed thereby to form the outer surface protection layer region Z. After the after-vacuum evaporation, the atmosphere was released to the open air to end the formation of the vapor deposited film.

Figure 4:
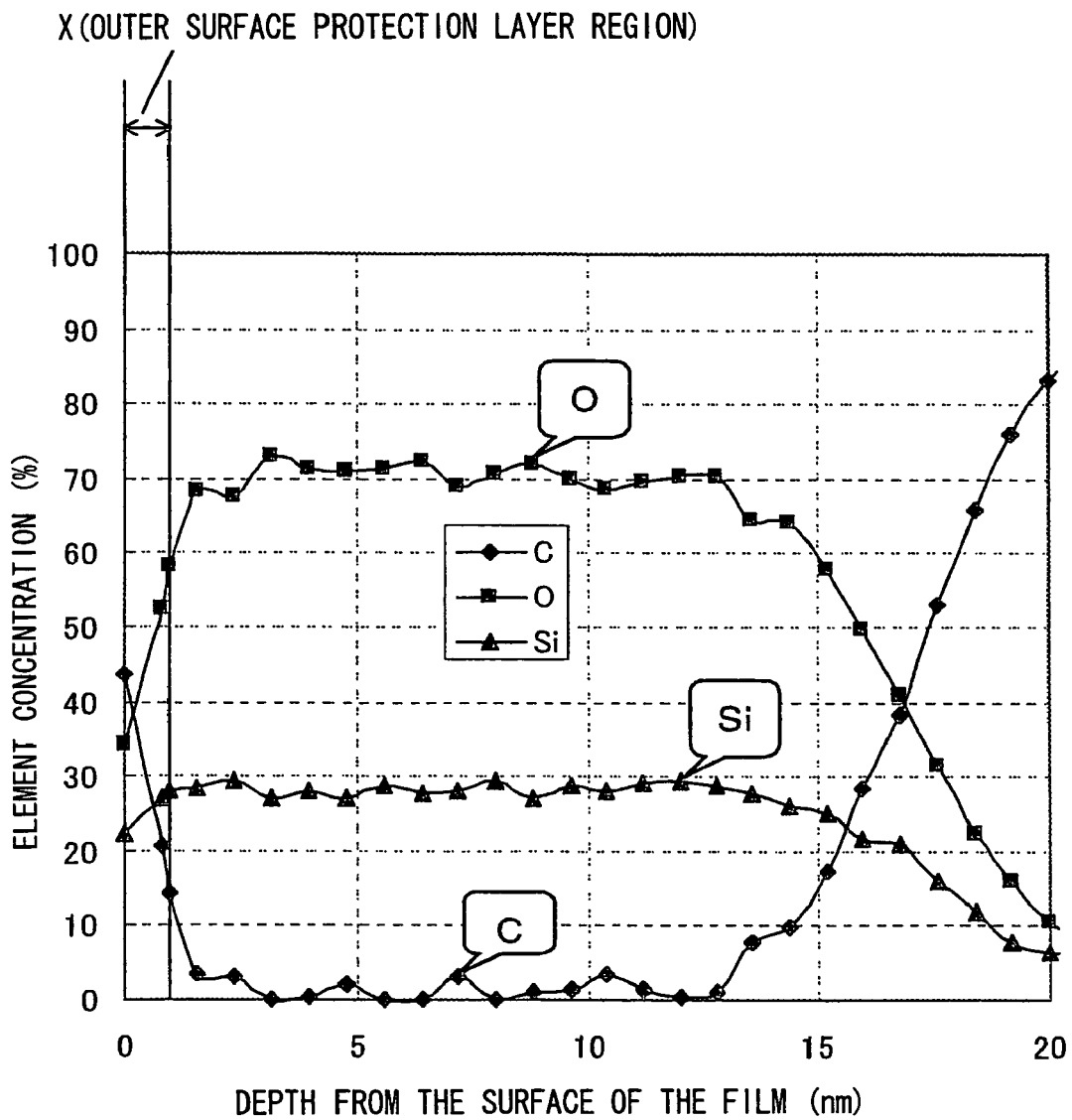
FIG. 4 is a diagram of element concentrations in the direction of thickness of the vapor deposited film in Example 4.
Figure 5:
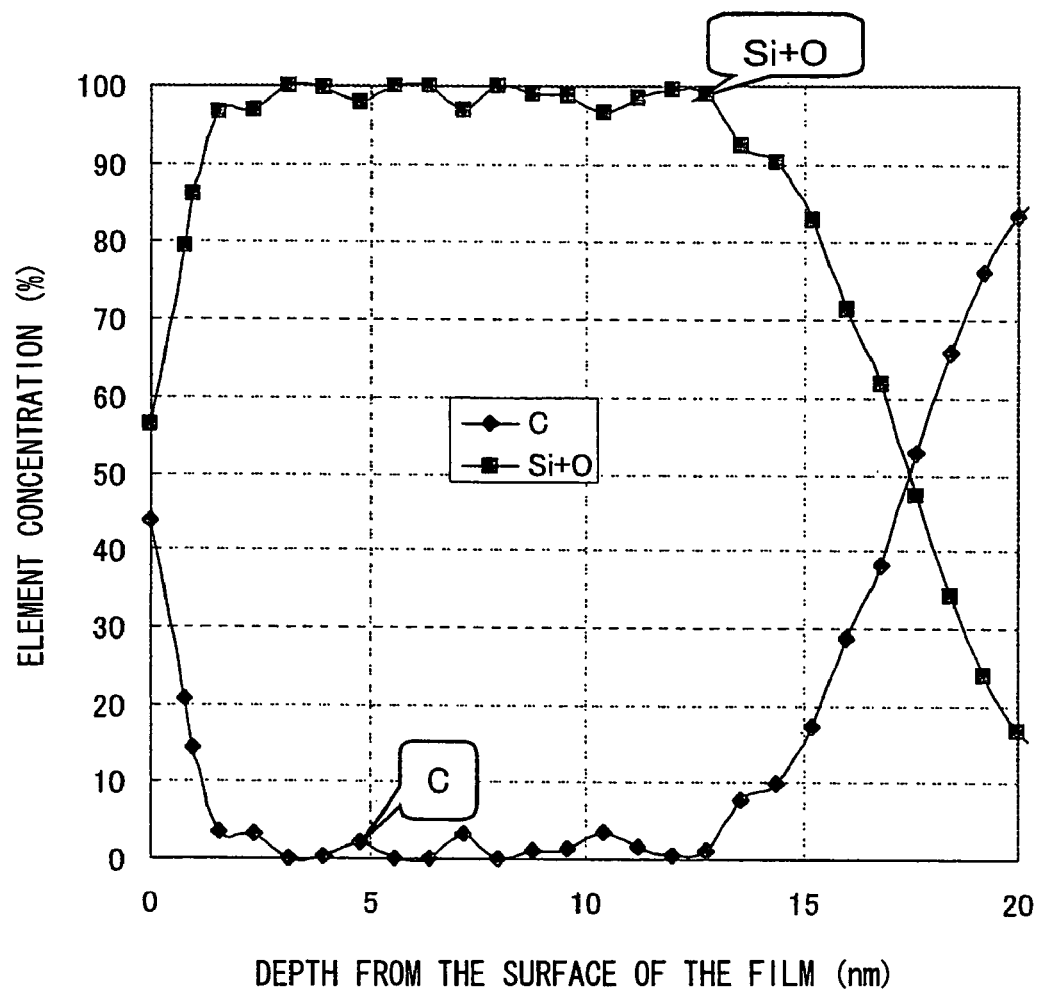
FIG. 5 is a reference diagram representing the concentrations of silicon and oxygen in FIG. 4 as Si+O.
Figure 6:
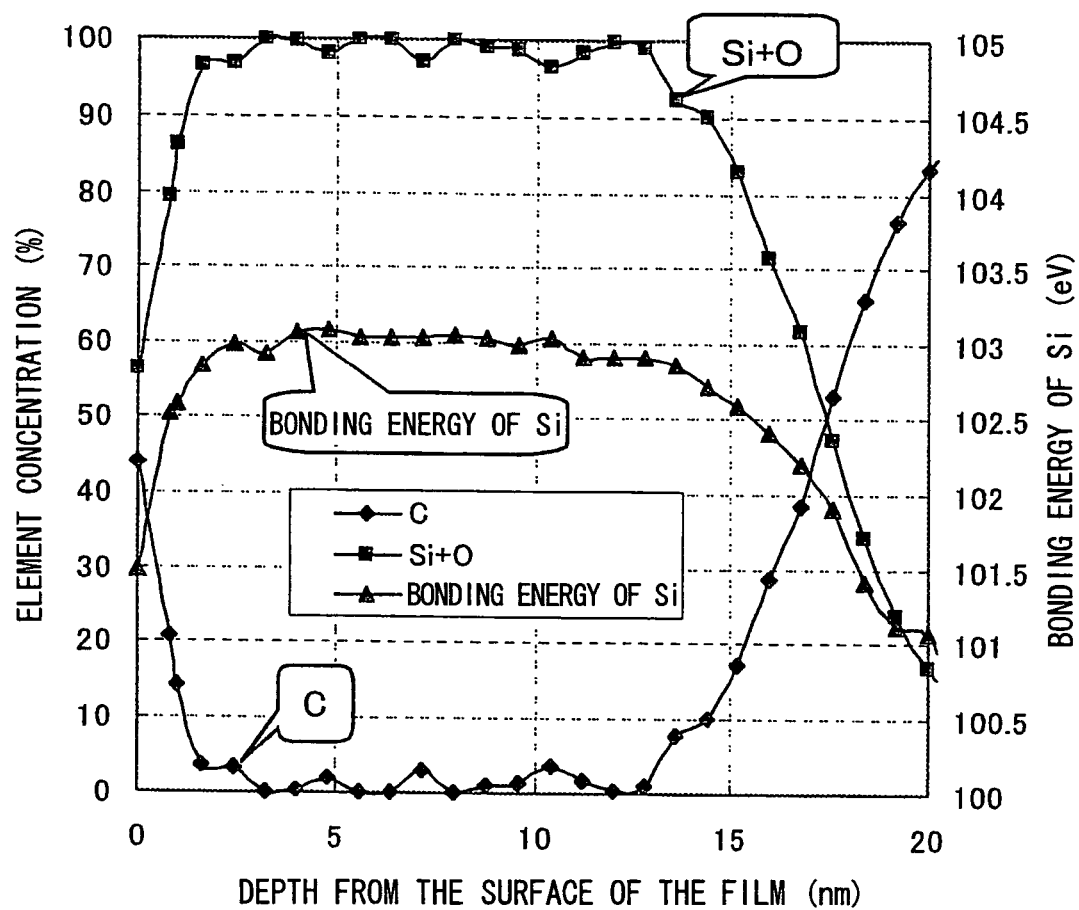
FIG. 6 is a reference diagram illustrating bonding energy of silicon in FIG. 5.

FIG. 4 shows the composition profile of silicon, oxygen and carbon in the direction of depth of the film relying upon the method of analyzing the composition in the vapor deposited film that is obtained. In the composition profile of FIG. 4, the sum of concentrations of silicon and oxygen is shown in FIG. 5 as Si+O. Further, the bonding energy of silicon in FIG. 5 is shown in FIG. 6.

[Applied Experiment 2]

A vapor deposited film was formed in the same manner as in Applied Experiment 1 with the exception of feeding oxygen at a rate of 3 sccm in the after-vacuum evaporation.

[Applied Experiment 3]

A vapor deposited film was formed in the same manner as in Applied Experiment 1 with the exception of varying the output of the microwaves to 50 W in the pre-vacuum evaporation, to 500 W in the main vacuum evaporation and to 50 W in the after-vacuum evaporation, and feeding oxygen at a rate of 6 sccm in the after-vacuum evaporation.

[Applied Experiment 4]

A vapor deposited film was formed in the same manner as in Applied Experiment 1 with the exception of feeding oxygen at a rate of 9 sccm in the after-vacuum evaporation.

Figure 7:
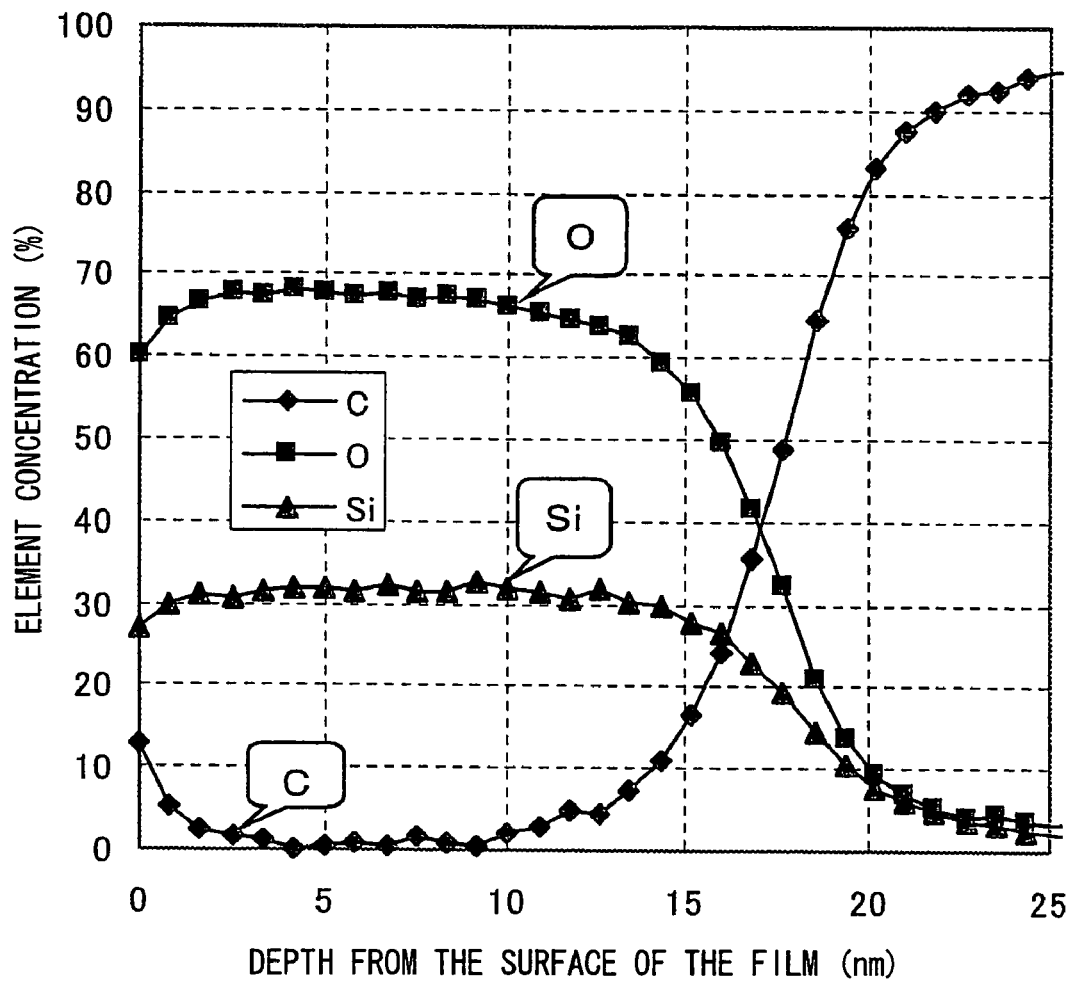
FIG. 7 is a diagram of element concentrations in the direction of thickness of a vapor deposited film in Comparative Example 4.
Figure 8:
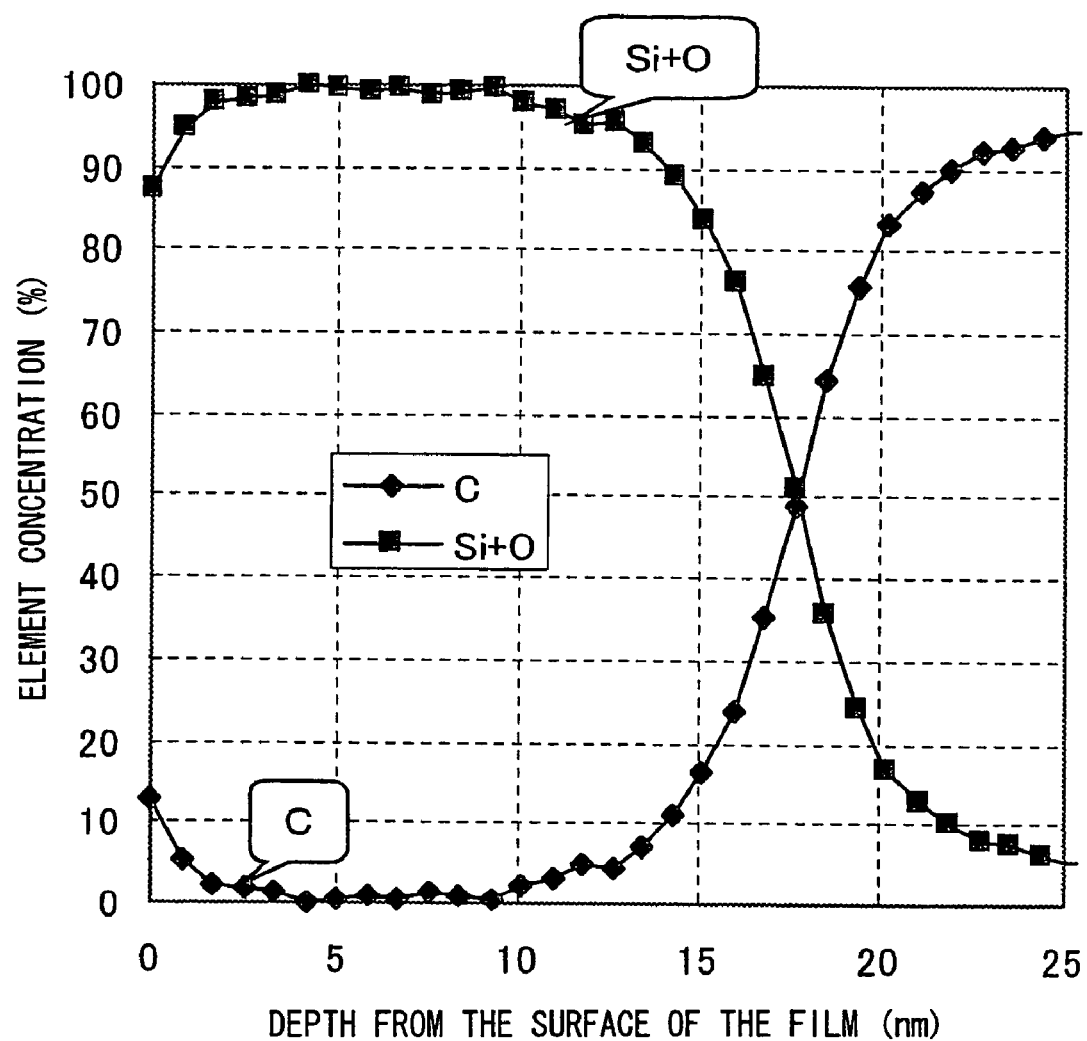
FIG. 8 is a reference diagram representing the concentrations of silicon and oxygen in FIG. 7 as Si+O.

The inner surface of the body wall of the bottle was measured for its composition profile of silicon, oxygen and carbon in the direction of depth of the film in the same manner as in Applied Experiment 1 as shown in FIG. 7. Further, in the composition profile of FIG. 7, the sum of concentrations of silicon and oxygen is shown in FIG. 8 as Si+O.

[Applied Experiment 5]

A vapor deposited film was formed in the same manner as in Applied Experiment 1 with the exception of feeding oxygen at a rate of 15 sccm in the after-vacuum evaporation.

[Applied Experiment 6]

A vapor deposited film was formed in the same manner as in Applied Experiment 1 with the exception of feeding oxygen at a rate of 30 sccm in the after-vacuum evaporation.

The evaluated results of the above Applied Experiments 1 to 7 are shown in Table 2. In the Applied Experiments 4 to 7, however, the vapor deposited films did not possess the outer surface protection layer region containing carbon (C) at a concentration of not lower than 15 element %. Therefore, Table 2 shows concentrations of carbon (C) in the outer surface region only of the vapor deposited films.

It will be learned from the results of Table 2 that the vapor deposited films of the Applied Experiments 1 to 3 of the present invention are excellent in both oxygen-barrier property and water-barrier property.

The invention claimed is:

1. A method of forming a vapor deposited film of a metal oxide on the surface of a substrate by holding the substrate to be treated in a plasma-treating chamber, and effecting the treatment with a chemical plasma by feeding at least an organometal compound gas and an oxidizing gas into said treating chamber, wherein a method of forming a chemical vapor deposited film based on a plasma CVD method is characterized in that the rate of feeding the oxidizing gas is varied while maintaining constant the rate of feeding the organometal compound gas into the plasma-treating chamber during the formation of the vapor deposited film
wherein the same organometal compound is used throughout the formation of the vapor deposited film while feeding the gas of the organometal compound at a constant rate.

2. A method of forming a chemical vapor deposited film based on a plasma CVD method according to claim 1, wherein the rate of feeding the oxidizing gas is increased, or is increased and is, then, decreased during the formation of the vapor deposited film.

3. A method of forming a chemical vapor deposited film based on a plasma CVD method according to claim 1, wherein an organosilicon compound is used as the organometal compound gas.

4. A method of forming a chemical vapor deposited film based on a plasma CVD method according to claim 3, wherein there are conducted a pre-vacuum evaporation for feeding only the organosilicon compound gas into the plasma-treating chamber and, thereafter, a main vacuum evaporation for feeding the organosilicon compound gas together with the oxidizing gas into the plasma-treating chamber.

5. A method of forming a chemical vapor deposited film based on a plasma CVD method according to claim 1, wherein a glow discharge for the treatment with a chemical plasma is established in a microwave electric field or in a high-frequency electric field.

6. A method of forming a chemical vapor deposited film based on a plasma CVD method according to claim 4, wherein the treatment with a chemical plasma in the step of main vacuum evaporation is conducted by varying the glow discharge from a low output region through up to a high output region.

7. A method of forming a chemical vapor deposited film based on a plasma CVD method according to claim 3, wherein, after the main vacuum evaporation, an after-vacuum evaporation is conducted to effect the vacuum evaporation by decreasing or discontinuing the supply of the oxidizing gas into the plasma-treating chamber while feeding the organosilicon compound is fed at a constant rate.

8. A method of forming a chemical vapor deposited film based on a plasma CVD method according to claim 1, wherein said substrate is a plastic container.

9. A vapor deposited film formed on the surface of a substrate based on a plasma CVD method by using an organometal compound gas and an oxidizing gas as reaction gases; wherein
said vapor deposited film has a barrier layer region positioned on the side of the substrate and an outer surface protection layer region positioned on the surface of said barrier layer region; and
on the basis of three elements of a metal element (M) stemming from said organometal compound, oxygen (O) and carbon (C), said barrier layer region has an (M+O) concentration which is higher than that of the outer surface protection layer region, the (M+O) concentration is substantially continuously varying in an interfacial portion between said barrier layer region and the outer surface protection layer region, and said outer surface protection layer region has a (C) concentration of not lower than 15 element %.

10. A vapor deposited film according to claim 9, wherein the element ratio (M/O) in said barrier layer region is in a range of 1.8 to 2.4.

11. A vapor deposited film according to claim 9, wherein between said barrier layer region and the substrate surface, there is an adhesive layer region having an (M+O) concentration lower than that of the barrier layer region and having a (C) concentration of not lower than 20 element %.

12. A vapor deposited film according to claim 9, wherein said organometal compound is an organosilicon compound, and the metal (M) is silicon (Si).

13. A vapor deposited film according to claim 9, wherein said substrate is a plastic.

14. A plastic bottle wherein a vapor deposited film of claim 9 is formed on the inner surface thereof.

* * * * *